(12) United States Patent
Morita (10) Patent No.: US 11,756,965 B2
(45) Date of Patent: Sep. 12, 2023

(54) ELECTRO-OPTICAL DEVICE HAVING THICK INSULATING FILM AND ELECTRONIC APPARATUS

(71) Applicant: SEIKO EPSON CORPORATION, Tokyo (JP)

(72) Inventor: Kikuya Morita, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 17/580,608

(22) Filed: Jan. 20, 2022

(65) Prior Publication Data

US 2022/0238565 A1 Jul. 28, 2022

(30) Foreign Application Priority Data

Jan. 22, 2021 (JP) ................. 2021-008865

(51) Int. Cl.
*H01L 27/12* (2006.01)
*G02F 1/1362* (2006.01)
*G03B 21/20* (2006.01)
*G02F 1/1368* (2006.01)

(52) U.S. Cl.
CPC ........ *H01L 27/1255* (2013.01); *G02F 1/1368* (2013.01); *G02F 1/136209* (2013.01); *G02F 1/136213* (2013.01); *G03B 21/2013* (2013.01); *H01L 27/1248* (2013.01)

(58) Field of Classification Search
CPC combination set(s) only.
See application file for complete search history.

(56) References Cited

U.S. PATENT DOCUMENTS

| | | | |
|---|---|---|---|
| 2001/0005019 A1* | 6/2001 | Ishikawa | G02F 1/136213 257/E27.111 |
| 2004/0257489 A1* | 12/2004 | Gotoh | G02F 1/136209 257/E27.113 |
| 2017/0102596 A1 | 4/2017 | Sugimoto | |
| 2017/0256192 A1* | 9/2017 | Knepper | G09G 3/2092 |
| 2020/0075774 A1 | 3/2020 | Sugimoto | |
| 2020/0117063 A1 | 4/2020 | Sugimoto | |

FOREIGN PATENT DOCUMENTS

| | | |
|---|---|---|
| JP | 2003-152086 | 5/2003 |
| JP | 2004-271903 | 9/2004 |
| JP | 2004-325627 | 11/2004 |

(Continued)

*Primary Examiner* — Lauren Nguyen
(74) *Attorney, Agent, or Firm* — JCIPRNET (57) ABSTRACT

An electro-optical device includes a substrate having light-transmissivity, a capacitance element having light-transmissivity and including a first electrode, a dielectric layer, and a second electrode, a first insulating film having light-transmissivity, a light-shielding film, a second insulating film having light-transmissivity, and a transistor. The first electrode, the dielectric layer, the second electrode, the first insulating film, the light-shielding film, the second insulating film, and the transistor are layered in this order from the substrate side, and an interfacial reflection at the first insulating film side of the light-shielding film is greater than an interfacial reflection at the dielectric layer side of the first electrode with respect to light entering from the substrate.

8 Claims, 7 Drawing Sheets

(56) References Cited

FOREIGN PATENT DOCUMENTS

| JP | 2004-363300 | 12/2004 |
|----|-------------|---------|
| JP | 2005-115104 | 4/2005 |
| JP | 2015-094880 | 5/2015 |
| JP | 2017-072741 | 4/2017 |
| JP | 2019-039943 | 3/2019 |
| JP | 2020-038248 | 3/2020 |
| JP | 2020-064130 | 4/2020 |

* cited by examiner

TABLE 1

| m | d1 |
|---|---|
| 0 | 94.17808 |
| 1 | 282.5342 |
| 2 | 470.8904 |
| 3 | 659.2466 |
| 4 | 847.6027 |
| 5 | 1035.959 |
| 6 | 1224.315 |

FIG. 6

TABLE 2

| m | d2 |
|---|---|
| 0 | 24.67153 |
| 1 | 91.58151 |
| 2 | 158.4915 |
| 3 | 225.4015 |
| 4 | 292.3114 |
| 5 | 359.2214 |
| 6 | 426.1314 |

ELECTRO-OPTICAL DEVICE HAVING THICK INSULATING FILM AND ELECTRONIC APPARATUS

The present application is based on, and claims priority from JP Application Serial Number 2021-008865, filed Jan. 22, 2021, the disclosure of which is hereby incorporated by reference herein in its entirety.

BACKGROUND

1. Technical Field

The present disclosure relates to an electro-optical device and an electronic apparatus.

2. Related Art

For electronic devices such as projectors, for example, an electro-optical device such as a liquid crystal display whose optical characteristics can be varied for each pixel is used.

The electro-optical device described in JP-A-2017-72741 includes an element substrate, a counter substrate, and a liquid crystal layer sandwiched by these substrates. The element substrate includes a scanning line, a transistor, a pixel capacitor, a data line, and a pixel electrode provided in this order on the substrate. The scanning line is formed of a light-shielding conductive material. Light incident from the substrate toward the transistor is shielded by arranging the scanning line between the transistor and the substrate. By shielding the light incident on the transistor, it is possible to prevent operation of the transistor from becoming unstable, and thus to suppress possibility of display defects such as luminance unevenness of the pixels.

In order to further enhance the light-shielding property to the transistor, for example, a measure for increasing the thickness of the scanning line can be considered. However, when the thickness of the scanning line is increased, the substrate may be cracked due to the difference in thermal stress between the scanning line and the substrate during manufacturing. Accordingly, other measures capable of further improving the light-shielding properties of the transistor with respect to the light entering from the substrate are needed.

SUMMARY

An aspect of an electro-optical device according to the present disclosure includes a substrate having light-transmissivity, a capacitance element having light-transmissivity and including a first electrode, a dielectric layer, and a second electrode, a first insulating film having light-transmissivity, a light-shielding film, a second insulating film having light-transmissivity, and a transistor. The first electrode, the dielectric layer, the second electrode, the first insulating film, the light-shielding film, the second insulating film, and the transistor are layered in this order from the first substrate side, and an interfacial reflection at the first insulating film side of the light-shielding film is greater than an interfacial reflection at the dielectric layer side of the first electrode with respect to light entering from the first substrate.

Further, an aspect of the electro-optical device according to the present disclosure includes a substrate having light-transmissivity, a capacitance element having light-transmissivity and including a first electrode, a dielectric layer, and a second electrode, a first insulating film having light-transmissivity, a light-shielding film, a second insulating film having light-transmissivity, and a transistor. The first electrode, the dielectric layer, the second electrode, the first insulating film, the light-shielding film, the second insulating film, and the transistor are layered in this order from the substrate side, the first insulating film has a thickness thicker than that of the first electrode, the dielectric layer, the second electrode, or the light-shielding film, and the first insulating film has a refractive index smaller than that of the second electrode.

An aspect of an electronic apparatus according to the present disclosure includes the above-described electro-optical device and a control unit configured to control operation of the electro-optical device.

DESCRIPTION OF EXEMPLARY EMBODIMENTS

Preferred embodiments of the present disclosure will be described below with reference to the accompanying drawings. Note that, in the drawings, dimensions or scales of sections are differed from actual dimensions or scales as appropriate, and some of the sections are schematically illustrated to make them easily recognizable. Further, the scope of the present disclosure is not limited to these embodiments unless otherwise stated to limit the present disclosure in the following descriptions.

1. Electro-Optical Apparatus

1A. Basic Configuration

Figure 1:
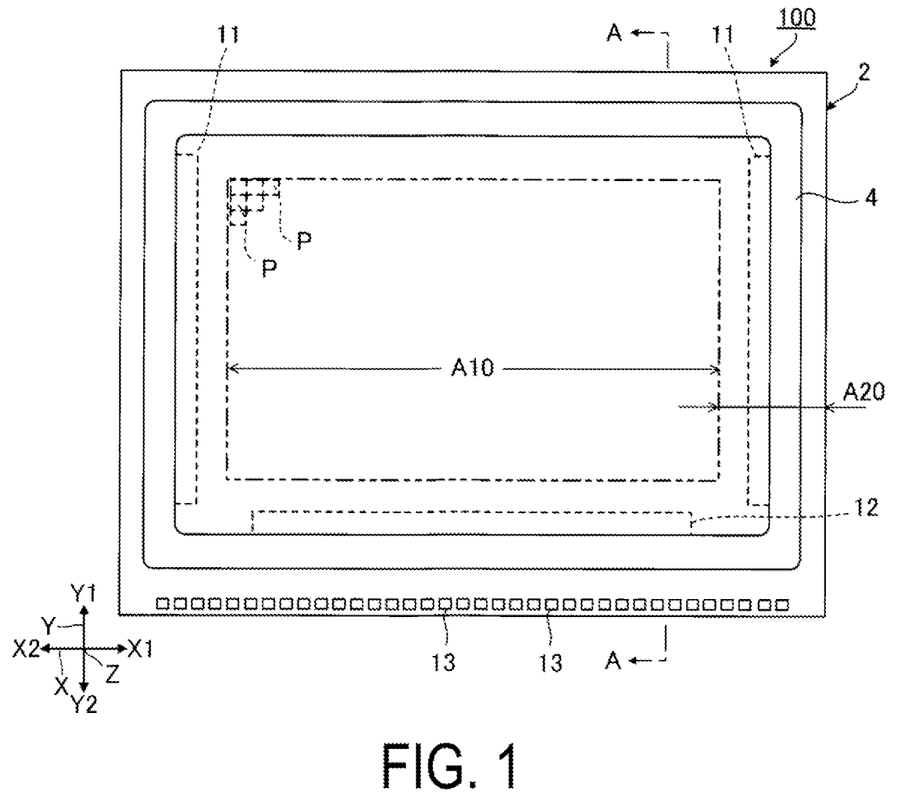
FIG. 1 is a plan view of an electro-optical device according to an exemplary embodiment.
Figure 2:
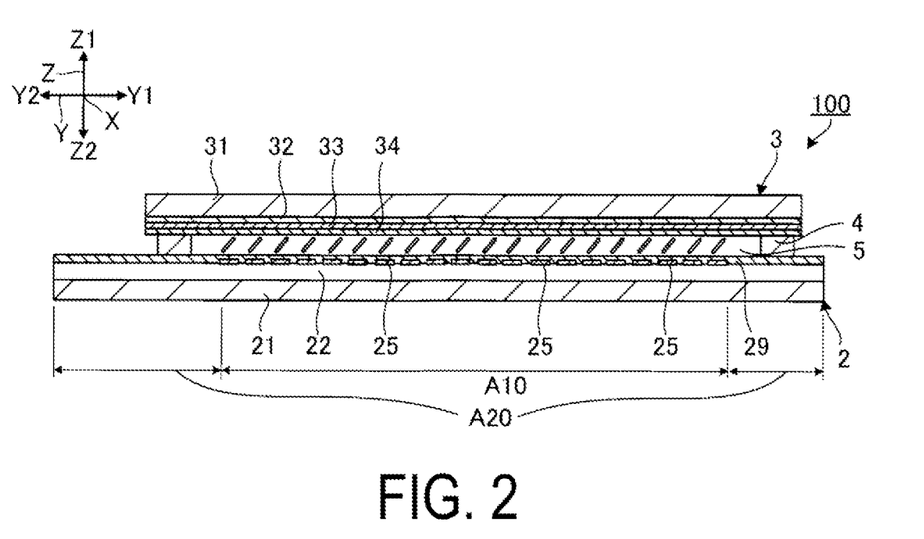
FIG. 2 is a cross-sectional view taken along a line AA of the electro-optical device illustrated in FIG. 1.

FIG. 1 is a plan view of an electro-optical device 100 according to an exemplary embodiment. FIG. 2 is a cross-sectional view taken along a line AA of the electro-optical device 100 illustrated in FIG. 1. Note that in FIG. 1, an illustration of a counter substrate 3 is omitted. Further, for convenience of explanation, the description will be made appropriately using an X-axis, a Y-axis, and a Z-axis orthogonal to each other. Further, one direction along the X-axis is described as an X1 direction, and the direction opposite to the X1 direction is described as an X2 direction. Similarly, one direction along the Y-axis is described as a Y1 direction, and the direction opposite the Y1 direction is described as a Y2 direction. One direction along the Z-axis is described as a Z1 direction, and the direction opposite the Z1 direction is described as a Z2 direction. Further, in the following, viewing in the Z1 direction or the Z2 direction is referred to as "plan view", and viewing from a direction perpendicular to a cross section including the Z-axis is referred to as "cross-sectional view".

The electro-optical device 100 illustrated in FIGS. 1 and 2 is a transmission-type electro-optical device of an active matrix drive system. As illustrated in FIG. 2, the electro-optical device 100 includes an element substrate 2, the counter substrate 3, a sealing member 4 having a frame shape, and a liquid crystal layer 5. The element substrate 2, the liquid crystal layer 5, and the counter substrate 3 are arranged in this order in the Z1 direction. Further, the shape of the electro-optical device 100 illustrated in FIG. 1 in plan view is square, but may be, for example, circular.

The element substrate 2 illustrated in FIG. 2 is a substrate including a plurality of TFTs (Thin Film Transistor) described later. The element substrate 2 includes a first substrate 21 having light-transmissivity, a laminate 22 having light-transmissivity, a plurality of pixel electrodes 25 having light-transmissivity, and a first alignment film 29 having light-transmissivity. Further, although not illustrated, the element substrate 2 includes a plurality of dummy pixel electrodes that surround the plurality of pixel electrodes 25 in plan view. In the following description, "light-transmissivity" refers to transparency to visible light, and means that a transmittance of visible light may be greater than or equal to 50%.

The first substrate 21, the laminate 22, the plurality of pixel electrodes 25, and the first alignment film 29 are layered in this order in the Z1 direction. The first substrate 21 is an example of a "substrate". The first substrate 21 is a flat plate having light-transmissivity and insulating properties. The first substrate 21 is, for example, a glass substrate or a quartz substrate. The laminate 22 includes a plurality of insulating films having light-transmissivity and various wirings arranged between each of the plurality of insulating films. The laminate 22 will be described later. Further, the pixel electrode 25 has light-transmissivity and conductivity. The pixel electrode 25 is used to apply an electric field to the liquid crystal layer 5. The pixel electrode 25 includes, for example, a transparent conductive material such as Indium Tin Oxide (ITO), Indium Zinc Oxide (IZO), and Fluorine-doped tin oxide (FTO). The first alignment film 29 has light-transmissivity and insulating properties. The first alignment film 29 aligns the liquid crystal molecules contained in the liquid crystal layer 5. The first alignment film 29 is arranged so as to cover the plurality of pixel electrodes 25. The material of the first alignment film 29 is, for example, polyimide, silicon oxide, and the like.

The counter substrate 3 is a substrate arranged so as to face the element substrate 2. The counter substrate 3 includes a second substrate 31 having light-transmissivity, an insulating layer 32 having light-transmissivity, a common electrode 33 having light-transmissivity, and a second alignment film 34 having light-transmissivity. Further, although not illustrated, the counter substrate 3 includes a light-shielding parting that surrounds the plurality of pixel electrodes 25 in plan view. In the present specification, "light-shielding property" means the light-shielding property to visible light, and means that a transmittance of visible light may be less than 50%, and more preferably may be equal to or less than 10%.

The second substrate 31, the insulating layer 32, the common electrode 33, and the second alignment film 34 are layered in this order in the Z2 direction. The second substrate 31 is a flat plate having light-transmissivity and insulating properties. The second substrate 31 is, for example, a glass substrate or a quartz substrate. The insulating layer 32 has light-transmissivity and insulating properties, and is formed from, for example, an inorganic material including silicon such as silicon oxide. The common electrode 33 is a counter electrode that is arranged with respect to the plurality of pixel electrodes 25 via the liquid crystal layer 5. The common electrode 33 is used to apply an electric field to the liquid crystal layer 5. The common electrode 33 has light-transmissivity and conductivity. The common electrode 33 includes, for example, a transparent conductive material such as ITO, IZO and FTO. The second alignment film 34 has light-transmissivity and insulating properties. The second alignment film 34 aligns the liquid crystal molecules contained in the liquid crystal layer 5. The material of the second alignment film 34 is, for example, polyimide, silicon oxide, and the like.

The sealing member 4 is arranged between the element substrate 2 and the counter substrate 3. The sealing member 4 is formed using an adhesive containing various types of curable resins such as epoxy resin, for example. The sealing member 4 may include a gap material made of an inorganic material such as glass.

The liquid crystal layer 5 is arranged in a region surrounded by the element substrate 2, the counter substrate 3, and the sealing member 4. The optical characteristics of the liquid crystal layer 5 vary according to the electric field. The liquid crystal layer 5 contains liquid crystal molecules having positive or negative dielectric anisotropy. The alignment of the liquid crystal molecule varies according to the voltage applied to the liquid crystal layer 5.

As illustrated in FIG. 1, a plurality of scanning line drive circuits 11, a data line drive circuit 12, and a plurality of external terminals 13 are arranged at the element substrate 2. Although not illustrated, a portion of the plurality of external terminals 13 is coupled to a wiring drawn from the scanning line drive circuit 11 or the data line drive circuit 12. Further, the plurality of external terminals 13 include terminals to which a common potential is applied. The terminal is electrically coupled to the common electrode 33 of the counter substrate 3 via a wiring and a conductive material (not illustrated).

The electro-optical device 100 includes a display region A10 that displays an image, and a peripheral region A20 located outside the display region A10 in plan view. A plurality of pixels P arranged in a matrix pattern are provided in the display region A10. The plurality of pixel electrodes 25 are arranged one-to-one with respect to the plurality of pixels P. The common electrode 33 described above is commonly provided to the plurality of pixels P. Further, the peripheral region A20 surrounds the display region A10 in plan view. The scanning line drive circuit 11 and the data line drive circuit 12 are arranged in the peripheral region A20.

In the present embodiment, the electro-optical device 100 is a transmission-type. For example, an image is displayed by modulating the light incident on the counter substrate 3 by it is emitted from the element substrate 2. Note that an image may be displayed by modulating the light incident on the element substrate 2 by it is emitted from the counter substrate 3.

Further, the electro-optical device 100 is applied to, for example, a display device that performs color display such as a personal computer and a smart phone, which will be described later. When applied to the display device, a color filter is appropriately used for the electro-optical device 100. Further, the electro-optical device 100 is applied to, for example, a projection-type projector described later. In this case, the electro-optical device 100 functions as a light bulb. Note that in this case, the color filter is omitted from the electro-optical device 100.

1B. Electrical Configuration of Element Substrate 2

Figure 3:
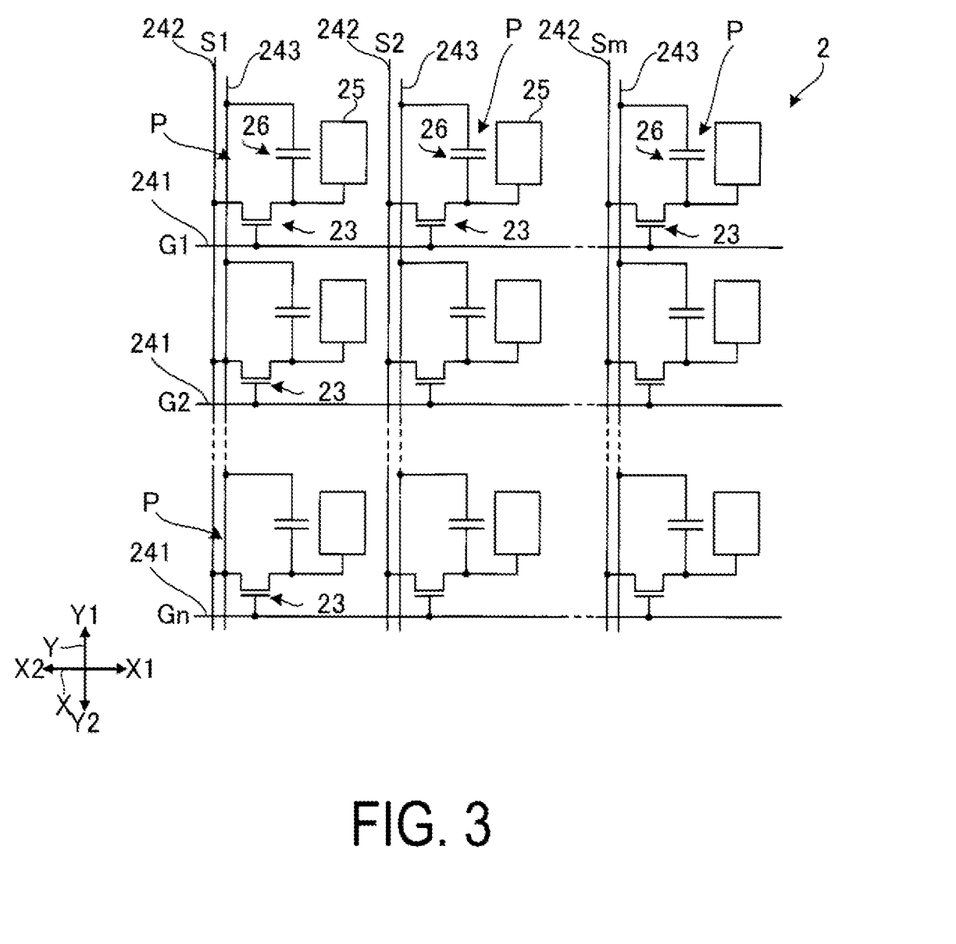
FIG. 3 is an equivalent circuit diagram illustrating an electrical configuration of the element substrate of FIG. 1.

FIG. 3 is an equivalent circuit diagram illustrating an electrical configuration of the element substrate 2 of FIG. 1. The laminate 22 of the element substrate 2 is provided with a plurality of transistors 23, n pieces of scanning lines 241, m pieces of data lines 242, and n pieces of constant potential lines 243 illustrated in FIG. 3. n and m are each an integer of 2 or greater. The transistor 23 is arranged corresponding to each intersection of n pieces of scanning lines 241 and m pieces of data lines 242. Each transistor 23 is, for example, a TFT that functions as a switching element. Each transistor 23 includes a gate, a source, and a drain.

Each of the n pieces of scanning lines 241 extends in the X1 direction, and the n pieces of scanning lines 241 are arranged at equal intervals in the Y1 direction. Each of the n pieces of scanning lines 241 is electrically coupled to the gate of the corresponding plurality of transistors 23. The n pieces of scanning lines 241 are electrically coupled to the scanning line drive circuit 11 illustrated in FIG. 1. Scanning signals G1, G2, . . . , and Gn are line-sequentially supplied to one to n pieces of the scanning lines 241 from the scanning line drive circuit 11.

Each of the m pieces of data lines 242 illustrated in FIG. 3 extends in the Y1 direction, and the m pieces of data lines 242 are arranged at equal intervals in the X1 direction. Each of the m pieces of data lines 242 is electrically coupled to the source of the corresponding plurality of transistors 23. The m pieces of data lines 242 are electrically coupled to the data line drive circuit 12 illustrated in FIG. 1. Image signals S1, S2, . . . , and Sm are supplied in parallel to one to m pieces of the data lines 242 from the data line drive circuit 12.

The n pieces of scanning lines 241 and the m pieces of data lines 242 illustrated in FIG. 3 are electrically insulated from each other and are arranged in a lattice-like pattern in plan view. A region surrounded by two adjacent scanning lines 241 and two adjacent data lines 242 corresponds to the pixel P. Each pixel electrode 25 is electrically coupled to the drain of the corresponding transistor 23.

Each of the n pieces of constant potential lines 243 extends in the Y1 direction, and the n pieces of constant potential lines 243 are arranged at equal intervals in the X1 direction. Further, the n pieces of constant potential lines 243 are electrically insulated from the m pieces of data lines 242 and the n pieces of scanning lines 241, and are arranged at intervals from these. A fixed potential such as a ground potential is applied to each constant potential line 243. Each of the n pieces of constant potential lines 243 is a capacitance line electrically coupled to corresponding capacitance element 26. Each capacitance element 26 is a retention capacitor for holding the potential of the pixel electrode 25. Note that the plurality of capacitance elements 26 are electrically coupled to the plurality of pixel electrodes 25 in a one-to-one manner. The plurality of capacitance elements 26 are electrically coupled to the drain of the plurality of transistors 23 in a one-to-one manner.

The scanning signals G1, G2, . . . , and Gn become sequentially active and n pieces of scanning lines 241 are sequentially selected, then the transistor 23 coupled to the selected scanning line 241 is turned to be on-state. Then, the image signals S1, S2, . . . , and Sm having magnitudes commensurate with the grayscale to be displayed are transmitted, via the m pieces of data lines 242, to the pixel P corresponding to the selected scanning line 241, and are then applied to the pixel electrodes 25. This allows a voltage in accordance with the grayscale to be displayed to be applied to the liquid crystal capacitor formed between the pixel electrode 25 and the common electrode 33 of FIG. 2, where the alignment of the liquid crystal molecules varies in accordance with the applied voltage. The applied voltage is held by the capacitance element 26. Such a variation in the alignment of the liquid crystal molecules causes the light to be modulated, to thus enable grayscale display.

1C. Specific Configuration of Element Substrate 2

Figure 4:
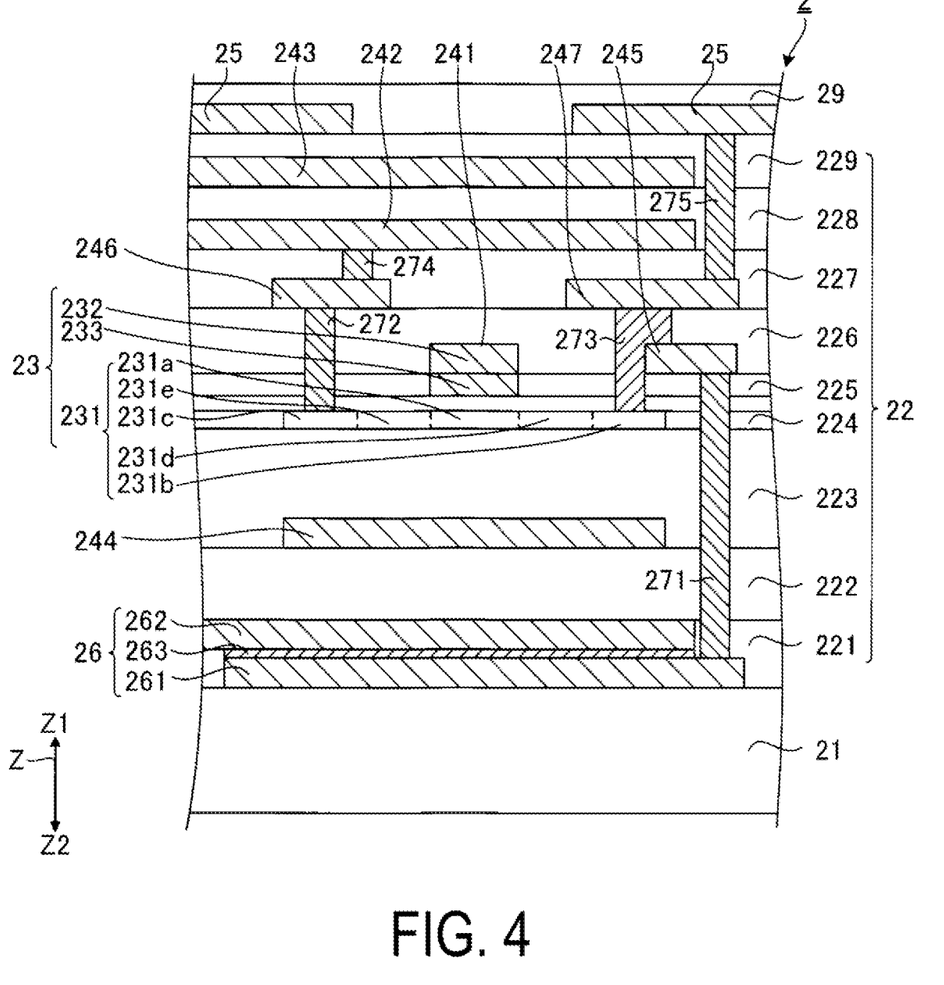
FIG. 4 is a cross-sectional view illustrating a part of the element substrate illustrated in FIG. 2.

FIG. 4 is a cross-sectional view illustrating a part of the element substrate 2 illustrated in FIG. 2. As illustrated in FIG. 4, the element substrate 2 includes the first substrate 21, the laminate 22, the plurality of pixel electrodes 25, and the first alignment film 29.

The laminate 22 has a plurality of insulating films 221, 222, 223, 224, 225, 226, 227, 228 and 229 arranged in the Z1 direction. The insulating films 221 to 229 have light-transmissivity and insulating properties. The material of each of the insulating films 221 to 229 is, for example, an inorganic material such as silicon oxynitride and silicon oxide. The insulating film 222 is an example of a "first insulating film", and the insulating film 223 is an example of a "second insulating film".

A plurality of wirings and the like are arranged in the laminate 22. Specifically, the transistor 23, the scanning line 241, the data line 242, the constant potential line 243, and the capacitance element 26 are arranged in the laminate 22. Further, a light-shielding film 244, a source relay electrode 246, a first drain relay electrode 245, and a second drain relay electrode 247 are arranged in the laminate 22. Further, contacts 271, 272, 273, 274, and 275 are arranged in the laminate 22. Each of the contacts 271 to 275 is arranged in a contact hole that is a through hole formed in the laminate 22. The contacts 271 to 275 are columnar plugs or trench wirings formed on the inner wall surface of the contact hole.

The capacitance element 26 is arranged on the first substrate 21. The capacitance element 26 includes a first electrode 261, a second electrode 262, and a dielectric layer 263. The first electrode 261, the dielectric layer 263, and the second electrode 262 are arranged in this order in the Z1 direction.

The light-shielding film 244 is arranged on the insulating film 222. The light-shielding film 244 has light-shielding properties and conductivity. When the scanning line 241 is a first scanning line, the light-shielding film 244 functions as a second scanning line. Note that the light-shielding film 244 may function as the second scanning line, or may be insulated from the scanning line 241.

The transistor 23 is arranged on the insulating film 223. The transistor 23 includes a semiconductor layer 231, a gate electrode 232, and a gate insulating film 233. The semiconductor layer 231 is arranged on the insulating film 223. The semiconductor layer 231 has a lightly doped drain (LDD) structure. Specifically, the semiconductor layer 231 includes a channel region 231a, a drain region 231b, a source region 231c, a low concentration drain region 231d, and a low concentration source region 231e. The channel region 231a is located between the drain region 231b and the source region 231c. The low concentration drain region 231d is located between the channel region 231a and the drain region 231b. The low concentration source region 231e is located between the channel region 231a and the source region 231c. The semiconductor layer 231 is formed, for example, by forming polysilicon. The region other than the channel region 231a are doped with impurities that enhance conductivity. The impurity concentration in the low concentration drain region 231d is lower than the impurity concentration in the drain region 231b. The impurity concentration in the low concentration source region 231e is lower than the impurity concentration in the source region 231c. Note that, for example, the low concentration source region 231e may be omitted.

Although a plan view is omitted, the gate electrode 232 overlaps the channel region 231a of the semiconductor layer 231 in plan view. The gate electrode 232 is formed, for example, by doping polysilicon with impurities that enhance conductivity. The gate electrode 232 may be formed by using a material having conductivity of a metal, a metal oxide, and a metal compound. Further, the gate insulating film 233 is interposed between the gate electrode 232 and the channel region 231a. The gate insulating film 233 is made of silicon oxide formed by, for example, thermal oxidation or a CVD (chemical vapor deposition) method.

The scanning line 241 and the first drain relay electrode 245 are arranged on the insulating film 225. The scanning line 241 is, for example, integrally formed with the gate electrode 232. The first drain relay electrode 245 is coupled to the first electrode 261 included in the capacitance element 26 described above via the contact 271.

The source relay electrode 246 and the second drain relay electrode 247 are arranged on the insulating film 226. The source relay electrode 246 is coupled to the source region 231c of the semiconductor layer 231 via the contact 272. The second drain relay electrode 247 is coupled to the drain region 231b of the semiconductor layer 231 and the first drain relay electrode 245 via the contact 273.

The data line 242 is arranged on the insulating film 227. The data line 242 is coupled to the source relay electrode 246 via the contact 274. The constant potential line 243 is arranged on the insulating film 228. The constant potential line 243 is electrically coupled to the second electrode 262 of the capacitance element 26 via a contact or the like (not illustrated). The pixel electrode 25 is arranged on the insulating film 229. The pixel electrode 25 is coupled to the second drain relay electrode 247 described above via the contact 275.

Examples of each material of the scanning line 241, the data line 242, the constant potential line 243, the light-shielding film 244, the source relay electrode 246, the first drain relay electrode 245, and the second drain relay electrode 247 described above include, for example, metal materials such as metals such as tungsten (W), titanium (Ti), chromium (Cr), iron (Fe), and aluminum (Al), metal nitrides such as titanium nitride, and metal oxides such as tungsten silicide. Furthermore, the various wirings and the like are constituted by a single layer or a laminate of these metal materials. Examples of each material of the contacts 271 to 280 include, for example, metal materials such as metals such as tungsten, cobalt (Co), and copper (Cu), metal nitrides, and metal oxides.

Further, although a plan view is omitted, the above-described various wirings and the like are arranged so as to surround the pixel electrode 25 in the plan view. The plurality of pixel electrodes 25 are arranged in a matrix in plan view, and the various wirings and the like are arranged in a frame shape surrounding the pixel electrodes 25 in plan view. A region in which the pixel electrode 25 is arranged in plan view is a region through which light is transmitted.

Note that the arrangement of the various wirings and the like included in the element substrate 2 illustrated in FIG. 4 is an example, and is not limited to the arrangement illustrated in FIG. 4.

1D. Configuration Below Transistor 23

Figure 5:
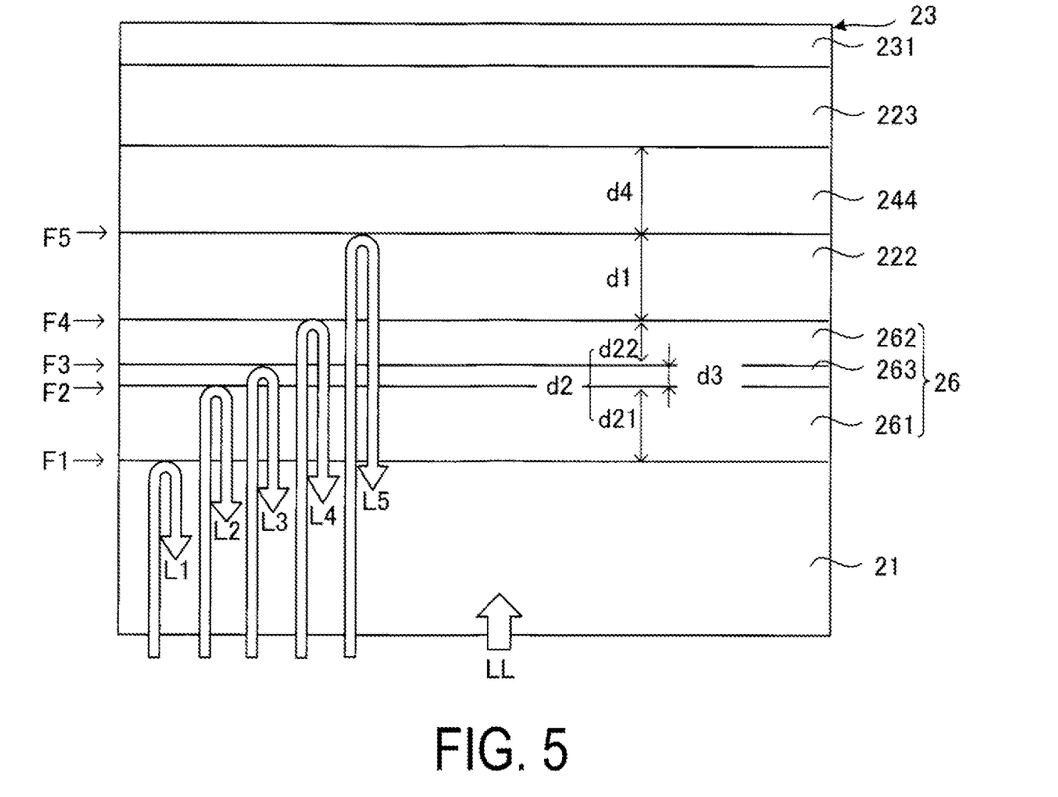
FIG. 5 is a diagram schematically illustrating a part of the element substrate illustrated in FIG. 4.

FIG. 5 is a diagram schematically illustrating a part of the element substrate 2 illustrated in FIG. 4. As described above, the element substrate 2 includes the first substrate 21 as a substrate, the capacitance element 26, the insulating film 222 as the first insulating film, the light-shielding film 244, and the insulating film 223 as the second insulating film, and the transistor 23. Accordingly, as illustrated in FIG. 5, the first substrate 21, the capacitance element 26, the insulating film 222, the light-shielding film 244, and the insulating film 223 are present in the layer below the transistor 23. Further, as described above, the capacitance element 26 includes the first electrode 261, the dielectric layer 263, and the second electrode 262. The first electrode 261, the dielectric layer 263, the second electrode 262, the insulating film 222, the light-shielding film 244, the insulating film 223, and the transistor 23 are layered in this order from the first substrate 21.

The capacitance element 26 and the insulating film 222 transmit a portion of light LL incident on the first substrate 21 and reflect another portion of the light LL. Specifically, at an interface F1 between the first substrate 21 and the first electrode 261, at an interface F2 between the first electrode 261 and the dielectric layer 263, at an interface F3 between the dielectric layer 263 and the second electrode 262, at an interface F4 between the second electrode 262 and the insulating film 222, and at an interface F5 between the insulating film 222 and the light-shielding film 244, a portion of the light LL is transmitted and another portion of the light LL is reflected. Note that the light-shielding film 244 may also transmit a portion of the light LL and reflect another portion of the light LL.

Each refractive index of the first electrode 261, the second electrode 262, and the light-shielding film 244 is higher than each refractive index of the dielectric layer 263, the insulating film 222, and the insulating film 223. The refractive index of the light-shielding film 244 is the highest. Then, the first electrode 261 with the high refractive index, the dielectric layer 263 with the low refractive index, the second electrode 262 with the high refractive index, the insulating film 222 with the low refractive index, and the light-shielding film 244 with the high refractive index are layered in this order. Therefore, the portion of the light LL can be reflected at each of the interfaces F1 to F5. Therefore, the portion of the light LL incident from the first substrate 21 becomes reflected light L1 at the interface F1, reflected light L2 at the interface F2, reflected light L3 at the interface F3, reflected light L4 at the interface F4, and reflected light L5 at the interface F5.

Further, by causing the thickness of the insulating film 222 to be thicker than the thickness of the first electrode 261, the dielectric layer 263, the second electrode 262, or the light-shielding film 244, the optical path length can be increased and the light reaching the light-shielding film 244 can be weaken. Further, by causing the refractive index of the insulating film 222 to be smaller than the refractive index of the second electrode 262, the light reaching the light-shielding film 244 can be weakened at the interface F4. Note that, even when the insulating film 222 is formed to be thick, occurrence of cracks and the like can be suppressed as compared with the light-shielding film 244.

The amount of the reflected light L5 at the interface F5 is greater than the amount of the reflected light L2 at the interface F2. That is, the interfacial reflection at the insulating film 222 side of the light-shielding film 244 is greater than the interfacial reflection at the dielectric layer 263 side of the first electrode 261 with respect to the light LL incident from the first substrate 21. The light is reflected at the interface F2 in addition to the reflection at the interface F5, so that the reflectance and an OD (Optical Density) value of the light LL in the layer below the transistor 23 can be increased as compared with the case where the interface F2 is not present. Accordingly, as compared with the case where only the light-shielding film 244 is provided in the layer below the transistor 23, the light-shielding film 244 and the capacitance element 26 are provided in the layer below the transistor 23, so that the light-shielding properties with respect to the transistor 23 can be improved without excessively thickening the light-shielding film 244.

Further, the capacitance element 26 and the insulating film 222 function as a part of a reflection enhancing film. Specifically, the interface F4 between the capacitance element 26 and the insulating film 222, and the interface F5 between the insulating film 222 and the light-shielding film 244 have reflection enhancing properties. More specifically, the reflection at the interface F4 and the reflection at the interface F5 are set to intensify each other. In other words, the insulating film 222 is configured such that the interfacial reflection at the second electrode 262 side and the interfacial reflection at the light-shielding film 244 side intensify each other with respect to the light LL incident from the first substrate 21.

The reflected light L4 at the interface F4 and the reflected light L5 at the interface F5 are set to intensify each other, so that the light amounts of the reflected light L4 and the reflected light L5 are combined. Therefore, the reflectance and the OD value of the light LL in the layer below the transistor 23 can be increased. Accordingly, as compared with the case where only the light-shielding film 244 is provided in the layer below the transistor 23, the light-shielding film 244, the capacitance element 26, and the insulating film 222 are provided in the layer below the transistor 23, so that the light-shielding properties with respect to the transistor 23 can be improved without excessively thickening the light-shielding film 244. As a result, the possibility of cracking in the insulating film 222 and the like can be suppressed, and also the light-shielding properties with respect to the transistor 23 can be improved. Therefore, according to the electro-optical device 100, a new measure capable of improving the light-shielding property of the transistor 23 with respect to the light LL incident from the first substrate 21 as compared with the conventional case while suppressing the occurrence of cracks can be provided. Therefore, display defects such as luminance unevenness of the pixels and the like can be suppressed, and thus deterioration of the display quality of the electro-optical device 100 can be suppressed.

By adjusting a thickness d1 of the insulating film 222 according to a wavelength A of the light LL incident on the first substrate 21, the reflection at the interface F4 and the reflection at the interface F5 are set to intensify each other. Specifically, the thickness d1 of the insulating film 222 may satisfy the following equation (1).

$$d1 = \{(1/2+m) \times \lambda\}/2 \times n1 \qquad (1)$$

In the equation (1), m is 0 or a natural number, A is the wavelength of the light LL incident from the first substrate 21, and n1 is the refractive index of the insulating film 222.

Figure 6:
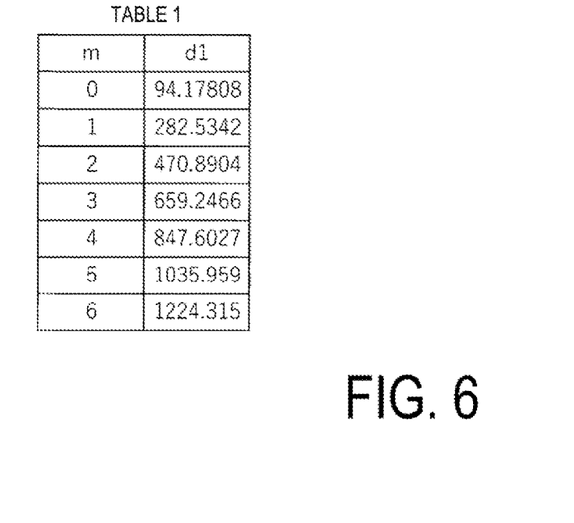
FIG. 6 is a table illustrating an example of a thickness of an insulating film illustrated in FIG. 5.

FIG. 6 is a table illustrating an example of the thickness d1 of the insulating film 222 illustrated in FIG. 5. For example, when the wavelength A is 550 nm and the refractive index n1 of the insulating film 222 is 1.46, the thickness d1 [nm] shown in Table 1 of FIG. 6 is calculated by using the equation (1).

When the thickness d1 satisfies the equation (1), the reflection at the interface F4 and the reflection at the interface F5 are set to intensify each other, so that the amount of light reflected in the layer below the transistor 23 can be increased. Therefore, the light-shielding properties with respect to the transistor 23 can be effectively improved.

Further, the reflected light L1 at the interface F1 and the reflected light L4 at the interface F4 are set to intensify each other. In other words, the first electrode 261 and the second electrode 262 are configured such that the interfacial reflection at the first substrate 21 side of the first electrode 261 and the interfacial reflection at the insulating film 222 side of the second electrode 262 intensify each other with respect to the light LL incident from the first substrate 21. With this configuration, the amount of light of the reflected light L1 and the reflected light L4 is combined, and as a result, the reflectance and the OD value of the light LL in the layer below the transistor 23 can be increased.

By adjusting a total thickness d2 of the first electrode 261 and the second electrode 262 according to the wavelength A of the light LL incident on the first substrate 21, the reflection at the interface F1 and the reflection at the interface F4 are set to intensify each other. Specifically, the total thickness d2 may satisfy the following equation (2).

$$d2 = \{(1/2+m) \times \lambda - 2 \times n3 \times d3\}/2 \times n2 \qquad (2)$$

In the equation (2), m is 0 or a natural number, A is the wavelength of the light LL incident from the first substrate 21, n2 is the refractive index of the first electrode 261 or the second electrode 262, n3 is the refractive index of the dielectric layer 263, and d3 is the thickness of the dielectric layer 263.

Figure 7:
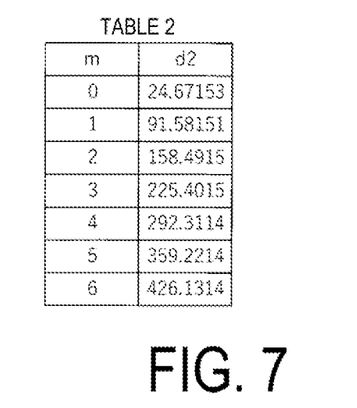
FIG. 7 is a table illustrating an example of a total thickness of a first electrode and a second electrode illustrated in FIG. 5.

FIG. 7 is a table illustrating an example of the total thickness d2 of the first electrode 261 and the second electrode 262 illustrated in FIG. 5. For example, when the wavelength A is 550 nm, the refractive index n2 of each of the first electrode 261 and the second electrode 262 is 4.11, the refractive index n3 of the dielectric layer 263 is 1.9, and the thickness d3 of the dielectric layer 263 is 19 nm, the total thickness d2 shown in Table 2 in FIG. 7 is calculated by using the equation (2).

When the total thickness d2 satisfies the equation (2), the reflection at the interface F1 and the reflection at the interface F4 are set to intensify each other, so that the amount of light reflected in the layer below the transistor 23 can be increased. Therefore, the light shielding properties with respect to the transistor 23 can be effectively improved.

Further, in order to further improve the light-shielding property with respect to the transistor 23, the total thickness d2 of the first electrode 261 and the second electrode 262 and the thickness d1 of the insulating film 222 are more preferably set such that the reflected light L1, L4 and L5 intensify each other.

Furthermore, it is most preferable that the reflected light L1 to L5 are set so as to intensify each other. Accordingly, it is most preferable that a thickness d21 of the first electrode 261, the thickness d3 of the dielectric layer 263, the thickness d22 of the second electrode 262, the thickness d1 of the insulating film 222, and the thickness d4 of the light-shielding film 244 are set such that the reflected light L1 to L5 intensify each other. As a result, the light-shielding properties with respect to the transistor 23 can be most effectively improved. However, the dielectric layer 263 depends on the withstand voltage of the electrostatic capacitance of the capacitance element 26. Therefore, substantially, by adjusting the total thickness d2 of the first electrode 261 and the second electrode 262, the thickness d1 of the insulating film 222, and the thickness d4 of the light-shielding film 244, the light-shielding property with respect to the transistor 23 can be most effectively improved.

Further, although the plan view is omitted, the transistor 23, the light-shielding film 244, and the capacitance element 26 overlap each other in plan view. Therefore, light incident on the transistor 23 can be effectively suppressed by the light-shielding film 244 and the capacitance element 26.

Further, by setting the materials of the capacitance element 26 and the insulating film 222, the reflection enhancing property of the capacitance element 26 and the insulating film 222 can be increased.

Specifically, examples of each material of the first electrode 261 and the second electrode 262 include a thin film material such as titanium, polysilicon, or the like. Of these, the first electrode 261 and the second electrode 262 may include polysilicon. Note that the polysilicon contains an impurity such as phosphorus (P). Further, as the dielectric layer 263, silicon nitride, silicon oxide, and the like are used. Furthermore, for example, aluminum oxide, hafnium oxide, or a multilayer film in which these metal oxide films and metal nitride films are layered is used.

When the first electrode 261 and the second electrode 262 include polysilicon, heat resistance can be easily improved as compared with the case where the first electrode 261 and the second electrode 262 include metal materials. Therefore, during manufacturing, occurrence of defects such as cracks in the insulating film 222 and the like can be suppressed. Furthermore, occurrence of film peeling of the first electrode 261 and the second electrode 262 can be reduced.

The insulating film 222 may include an inorganic material containing silicon such as silicon oxide and silicon oxynitride, and more preferably contains silicon oxide. When the insulating film 222 includes an inorganic material containing silicon, it is possible to suppress occurrence of defects such as cracks in the insulating film 222 and the like during manufacturing, when the second electrode 262 is polysilicon.

Examples of the material of the light-shielding film 244 include a metal material as described above. Of these, the light-shielding film 244 may include tungsten silicide. When the light-shielding film 244 includes tungsten silicide, it is easy to set the difference in refractive index between the light-shielding film 244 and the insulating film 222 to a desired value without excessively increasing the thickness d4 of the light-shielding film 24, when the insulating film 222 is a material including silicon. Further, since it is not necessary to excessively thicken the thickness d4, cracks do not easily occur in the insulating film 222 or the like even due to heat during manufacturing.

As described above, the thickness of each layer is set according to the wavelength A of the light LL incident from the first substrate 21. For example, examples in which the thickness of each layer is set according to the light in the green wavelength region is described below. In the first example in this case, the thickness d21 of the first electrode 261 is approximately 113 nm, the thickness d22 of the second electrode 262 is approximately 45 nm, the thickness d3 of the dielectric layer 263 is approximately 19 nm, the thickness d1 of the insulating film 222 is about 465 nm, and the thickness d4 of the light-shielding film 244 is approximately 200 nm. Further, in the second example, for example, the thickness d21 is approximately 45 nm, the thickness d22 is approximately 45 nm, the thickness d3 is approximately 19 nm, the thickness d1 is approximately 278 nm, and the thickness d4 is approximately 200 nm. With such a thickness, the reflectance and the OD value of the light LL in the layer below the transistor 23 can be increased.

Note that the first example and the second example are examples in which at least the reflected light L1, L4, and L5 are set to intensify each other. Further, the first example and the second example satisfy the equations (1) and (2). Furthermore, in the first example and the second example, the materials of the first electrode 261 and the second electrode 262 are polysilicon, the material of the dielectric layer 263 is silicon nitride, the material of the insulating film 222 is silicon oxide, and the material of the light-shielding film 244 is tungsten silicide.

Figure 8:
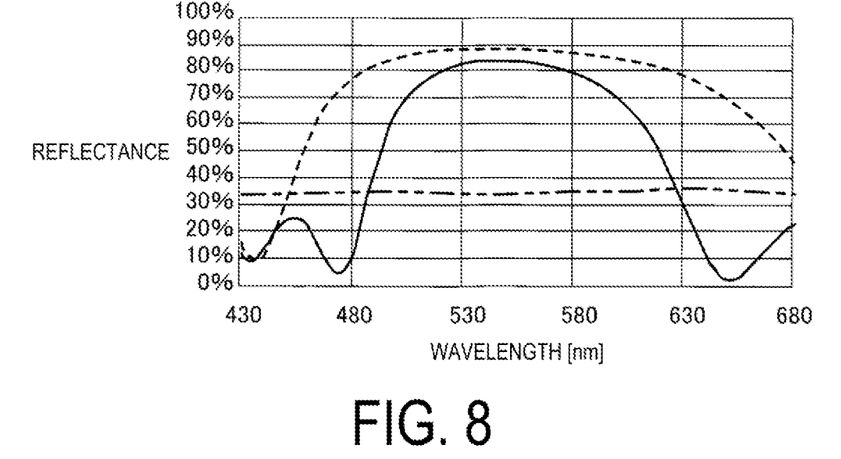
FIG. 8 is a diagram illustrating a reflectance in a green wavelength region.
Figure 9:
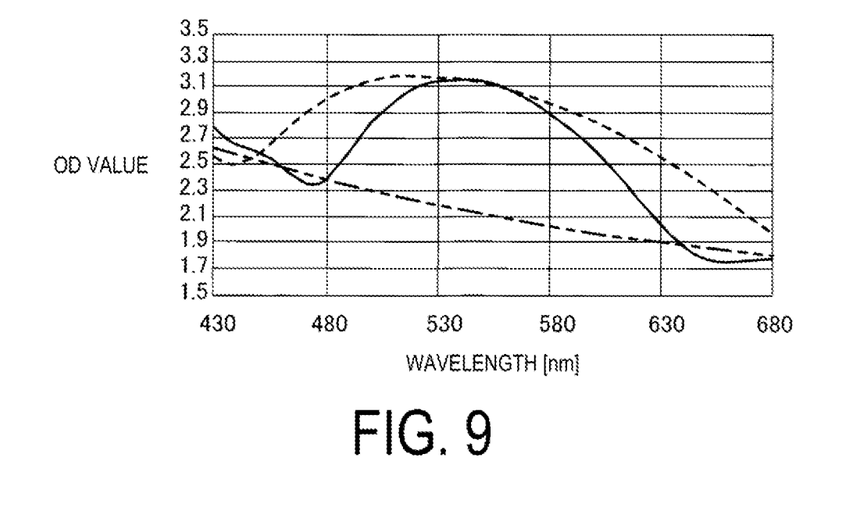
FIG. 9 is a diagram illustrating an OD value in the green wavelength region.

FIG. 8 is a diagram illustrating the reflectance in the green wavelength region. FIG. 8 illustrates simulation results of the reflectance from the first substrate 21 to the layer below the transistor 23. FIG. 9 is a diagram illustrating the OD value in the green wavelength region. FIG. 9 illustrates simulation results of the OD value from the first substrate 21 to the layer below the transistor 23. Two-dot chain lines illustrated in FIGS. 8 and 9 are the reflectance or the OD value when the capacitance element 26 and the insulating film 222 are not present between the first substrate 21 and the light-shielding film 244. Solid lines illustrate the reflectance or the OD value of the first example. Dashed lines illustrate the reflectance or the OD value of the second example. In both results, the materials are the same, only the thickness is varied. Further, the green wavelength region is specifically a wavelength region within a range from 500 nm to 580 nm.

As illustrated in FIGS. 8 and 9, since the predetermined capacitance element 26, insulating film 222, and light-shielding film 244 are present, the reflectance and the OD value in the green wavelength region can be significantly increased as compared with a case where only the scanning line 241 is present.

Note that the above example is an example, and other examples can be considered for each thickness. Further, although not illustrated, also in the red wavelength region, that is, the wavelength region in a range from more than 580 nm to 700 nm, the reflectance and the OD value can be increased by setting the thickness according to the wavelength A of the red wavelength region. Similarly, also in the blue wavelength region, that is, the wavelength region in a range from 400 nm to less than 500 nm, the reflectance and the OD value can be increased by setting the thickness according to the wavelength A of the blue wavelength region.

2. Modified Example

The embodiment exemplified above can be variously modified. Specific modification aspects applied to the embodiment described above are exemplified below. Two or more modes freely selected from exemplifications below can be appropriately used in combination as long as mutual contradiction does not arise.

In each of the above-described embodiments, the active matrix system electro-optical device 100 is exemplified, but it is not limited thereto, and the driving system of the electro-optical device 100 may be a passive matrix system or the like, for example.

The driving system of the "electro-optical device" is not limited to a vertical electric field system, and may be a transverse electric field system. Examples of the transverse electric field system include, for example, an IPS (In Plane Switching) mode. Furthermore, examples of the vertical electric field system include a TN (Twisted Nematic) mode, a VA (Vertical Alignment) mode, a PVA mode, and an OCB (Optically Compensated Bend) mode.

3. Electronic Apparatus

The electro-optical device 100 can be used for various electronic apparatuses.

Figure 10:
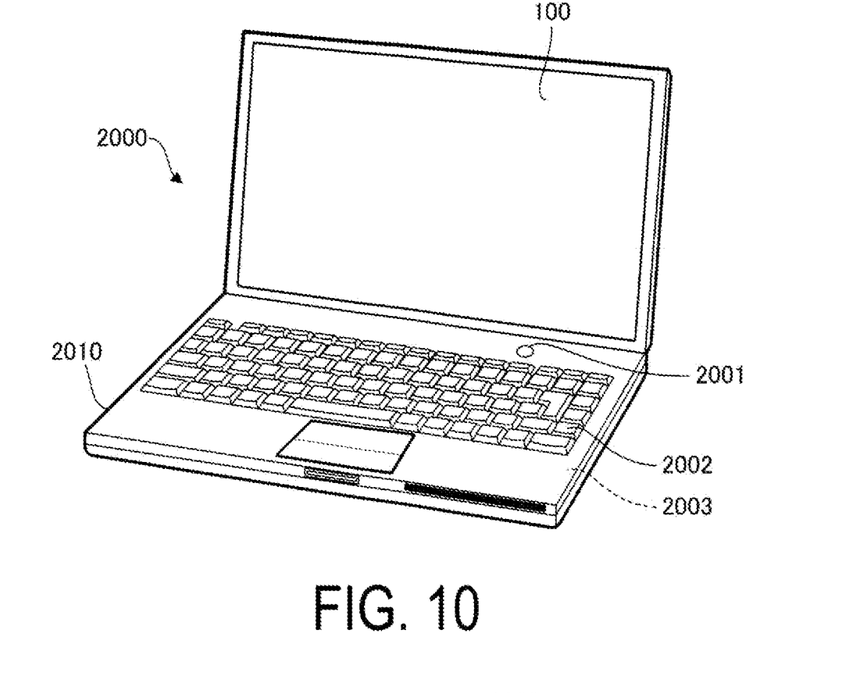
FIG. 10 is a perspective view illustrating a personal computer as an example of an electronic apparatus.

FIG. 10 is a perspective view illustrating a personal computer 2000 as an example of an electronic apparatus. The personal computer 2000 includes the electro-optical device 100 configured to display various images, a main body portion 2010 in which a power source switch 2001 and a keyboard 2002 are installed, and a control unit 2003. The control unit 2003 includes, for example, a processor and a memory, and controls the operation of the electro-optical device 100.

Figure 11:
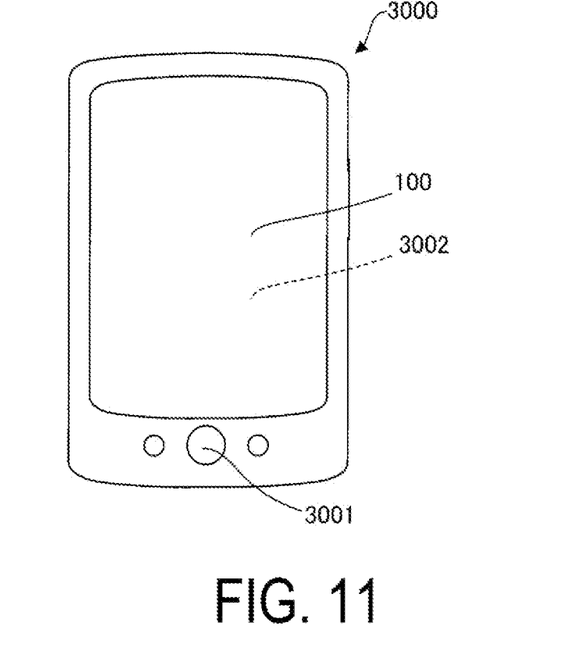
FIG. 11 is a plan view illustrating a smart phone as an example of the electronic apparatus.

FIG. 11 is a plan view illustrating a smart phone 3000 as an example of the electronic apparatus. The smart phone 3000 includes an operation button 3001, the electro-optical device 100 configured to display various images, and a control unit 3002. Screen contents displayed on the electro-optical device 100 are changed according to the operation of the operation button 3001. The control unit 3002 includes, for example, a processor and a memory, and controls the operation of the electro-optical device 100.

Figure 12:
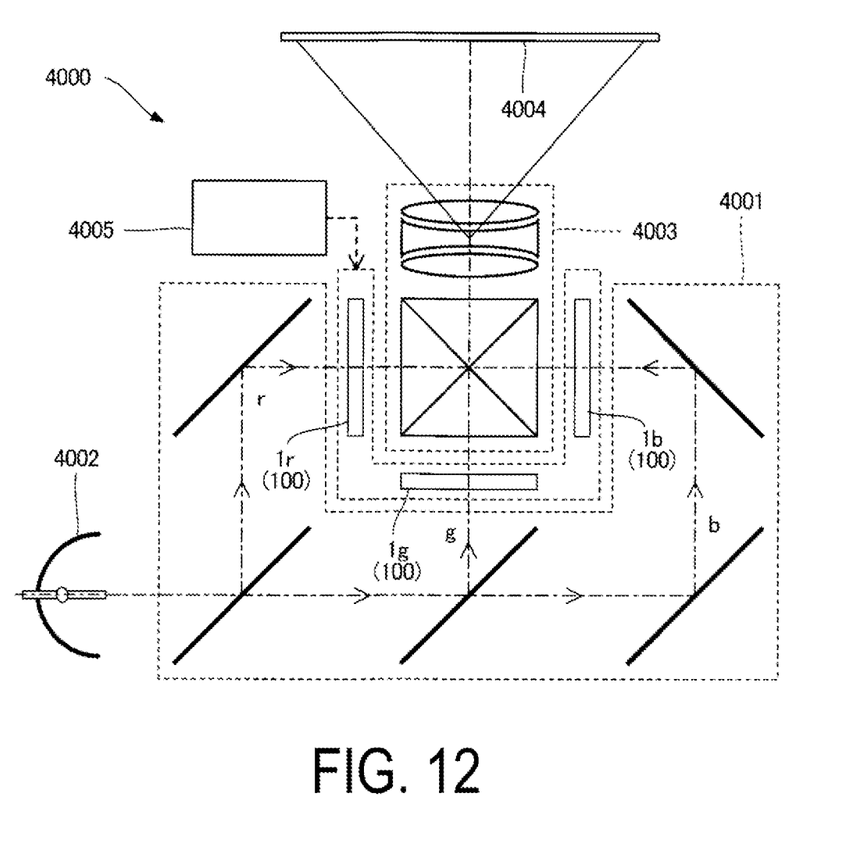
FIG. 12 is a schematic diagram illustrating a projector as an example of the electronic apparatus.

FIG. 12 is a schematic diagram illustrating a projector as an example of the electronic apparatus. The projection-type display device 4000 is a three-plate type projector, for example. An electro-optical device 1*r* is an electro-optical device 100 corresponding to a red display color, an electro-optical device 1*g* is an electro-optical device 100 corresponding to a green display color, and an electro-optical device 1*b* is an electro-optical device 100 corresponding to a blue display color. Specifically, the projection-type display device 4000 includes three electro-optical devices 1*r*, 1*g*, and 1*b* that respectively correspond to display colors of red, green, and blue. The control unit 4005 includes, for example, a processor and a memory, and controls the operation of the electro-optical device 100.

An illumination optical system 4001 supplies a red component r of light emitted from an illumination device 4002 as a light source to the electro-optical device 1*r*, a green component g of the light to the electro-optical device 1*g*, and a blue component b of the light to the electro-optical device 1*b*. Each of the electro-optical devices 1*r*, 1*g*, and 1*b* functions as an optical modulator, such as a light bulb, that modulates respective rays of the monochromatic light supplied from the illumination optical system 4001 depending on display images. A projection optical system 4003 combines the rays of the light emitted from each of the electro-optical devices 1*r*, 1*g*, and 1*b* to project the combined light to a projection surface 4004.

The above electronic apparatus includes the above-described electro-optical device 100 and the control unit 2003, 3002, or 4005. As described above, the electro-optical device 100 has excellent light-shielding properties with respect to the transistor 23, thereby suppressing display defects such as pixel luminance unevenness. Accordingly, by providing the electro-optical device 100, the display quality of the personal computer 2000, the smart phone 3000, or the projection-type display apparatus 4000 can be improved.

Examples of the electronic apparatus to which the electro-optical device of the present disclosure is applied is not limited to the exemplified apparatus, and include, for example, a Personal Digital Assistant (PDA), a digital still camera, a television, a video camera, a car navigation device, a display device for in-vehicle use, an electronic organizer, an electronic paper, an electronic calculator, a word processor, a workstation, a visual telephone, a POS (Point of Sale) terminal, and the like. Further, the examples of the electronic apparatus to which the present disclosure is applied include a device including a printer, a scanner, a copier, a video player, and a touch panel.

The present disclosure has been described above based on the preferred embodiment, but the present disclosure is not limited to the embodiment described above. In addition, the configuration of each component of the present disclosure may be replaced with any configuration that exerts the equivalent functions of the above-described embodiments, and to which any configuration may be added.

Further, in the description described above, a liquid crystal display device is described as an example of the electro-optical device of the present disclosure, but the electro-optical device of the present disclosure is not limited thereto. For example, the electro-optical device of the present disclosure can also be applied to an image sensor or the like.

What is claimed is:

1. An electro-optical device comprising:
   a substrate having light-transmissivity,
   a transistor having a semiconductor layer,
   a capacitance element having light-transmissivity and including a first electrode, a dielectric layer, and a second electrode, the capacitance element being disposed between the substrate and the transistor in a thickness direction of the substrate,
   a light-shielding film disposed between the capacitance element and the transistor in the thickness direction of the substrate,
   a first insulating film having light-transmissivity, and disposed between the light-shielding film and the capacitance element in the thickness direction of the substrate,
   a second insulating film having light-transmissivity, and disposed between the first insulating film and the semiconductor layer, and
   a third insulating film having light-transmissivity, and disposed between the first insulating film and the substrate in the thickness direction of the substrate, wherein
   an entirety of the capacitance element is disposed in the third insulating film, and
   each refractive index of the first electrode, the second electrode, and light-shielding film is higher than each refractive index of the dielectric layer, the first insulating film, and the second insulating film.

2. The electro-optical device according to claim 1, wherein
   a thickness d1 of the first insulating film satisfies the following equation (1):

$$d1 = \{(\tfrac{1}{2}+m) \times \lambda\}/2 \times n1 \qquad (1),$$

wherein m is 0 or a natural number, λ is a wavelength of the light entering from the substrate, and n1 is a refractive index of the first insulating film.

3. The electro-optical device according to claim 1, wherein
a total thickness d2 of the first electrode and the second electrode satisfies the following equation (2):

$$d2=\{(½+m)\times\lambda - 2\times n3\times d3\}/2\times n2 \qquad (2),$$

wherein
m is 0 or a natural number, λ is a wavelength of the light entering from the substrate, n2 is a refractive index of the first electrode or the second electrode, n3 is a refractive index of the dielectric layer, and d3 is a thickness of the dielectric layer.

4. The electro-optical device according to claim 1, wherein
the first insulating film has a thickness thicker than that of the first electrode, the dielectric layer, the second electrode, or the light-shielding film.

5. The electro-optical device according to claim 1, wherein
the first electrode and the second electrode include polysilicon.

6. The electro-optical device according to claim 1, wherein
the first insulating film includes an inorganic material containing silicon.

7. The electro-optical device according to claim 1, wherein
the light-shielding film includes tungsten silicide.

8. An electronic apparatus comprising:
the electro-optical device according to claim 1,
an illumination device configured to supply light emitted therefrom having a wavelength of a red component, a green component, or a blue component to the electro-optical device, and
a control unit configured to control operation of the electro-optical device.

* * * * *